US008686795B2

United States Patent
Okamura et al.

(10) Patent No.: US 8,686,795 B2
(45) Date of Patent: Apr. 1, 2014

(54) POWER AMPLIFIER

(75) Inventors: Atsushi Okamura, Tokyo (JP);
Takayuki Matsuzuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 13/611,844

(22) Filed: Sep. 12, 2012

(65) Prior Publication Data

US 2013/0207729 A1 Aug. 15, 2013

(30) Foreign Application Priority Data

Feb. 9, 2012 (JP) .................................. 2012-026142

(51) Int. Cl.
*H03F 3/04* (2006.01)
(52) U.S. Cl.
USPC .......................................... 330/296; 330/285
(58) Field of Classification Search
USPC ............................. 330/296, 285, 310, 150, 98
See application file for complete search history.

(56) References Cited

U.S. PATENT DOCUMENTS

| 8,138,836 | B2 * | 3/2012 | Matsuzuka et al. | 330/296 |
| 8,354,888 | B2 * | 1/2013 | Matsuzuka et al. | 330/296 |
| 8,519,797 | B2 * | 8/2013 | Wang | 330/311 |
| 8,593,224 | B1 * | 11/2013 | Yuen et al. | 330/289 |
| 2004/0251967 | A1 | 12/2004 | Moriwaki et al. | |
| 2008/0238553 | A1 | 10/2008 | Cho et al. | |
| 2009/0309655 | A1 | 12/2009 | Yamamoto et al. | |

FOREIGN PATENT DOCUMENTS

| JP | 6-283946 A | 10/1994 |
| JP | 6-296118 A | 10/1994 |
| JP | 2001-53563 A | 2/2001 |
| JP | 2004-343244 A | 12/2004 |
| JP | 2005-102099 A | 4/2005 |
| JP | 2005-260797 A | 9/2005 |
| JP | 2006-93896 A | 4/2006 |
| KR | 10-2008-0088224 A | 10/2008 |
| KR | 10-2009-0129321 A | 12/2009 |
| WO | WO 00/39921 A1 | 7/2000 |

OTHER PUBLICATIONS

Republic of Korea Patent Office; Korean Office Action in Korean Patent Application No. 10-2013-0009030 (Dec. 19, 2013).

* cited by examiner

*Primary Examiner* — Henry Choe
(74) *Attorney, Agent, or Firm* — Leydig, Voit & Mayer, Ltd.

(57) ABSTRACT

A power amplifier includes: an amplifier having a base into which input signals are input, a collector to which a collector voltage is supplied, and an emitter; and a bias circuit for supplying a bias current to the base of the amplifier. The bias circuit includes a first transistor having a first control terminal into which a reference voltage is input, a first terminal to which a power voltage is applied, and a second terminal connected to the base of the amplifier. A capacitance adjusting circuit elevates capacitance between a grounding point and at least one of the first control terminal and the first terminal when the collector voltage of the amplifier is lowered.

5 Claims, 6 Drawing Sheets

POWER AMPLIFIER

BACKGROUND OF THE INVENTION

1. Field of the Invention

The present invention relates to a power amplifier for mobile communications such as mobile telephones.

2. Background Art

Recently, as power amplifiers for mobile telephones represented by CDMA (Code Division Multiple Access), a GaAs-HBT (Hetero-junction Bipolar Transistor) power amplifier has been broadly used (for example, refer to Japanese Patent Application Laid-Open No. 2004-343244). These power amplifiers are mainly operated in middle and low output in urban areas where base stations are relatively concentrated. For this reason, the improvement of the operation efficiency in the times of middle and low output operations is effective for the elongation of the talk time of mobile telephone. Therefore, the improvement of operation efficiency in the time of middle and low output operations (ex. 0 to 17 dBm) in addition to the time of high output operations (ex. 28 dBm) has become important. To improve the operation efficiency in the time of middle and low output operations, a method to lower the collector voltage of an amplifier using a DC/DC convertor according to output power has been known.

FIG. 9 is a graph showing the relationship between the output power and distortion of the amplifier. FIG. 10 is a graph showing the relationship between the output power and the operation efficiency of the amplifier. If the collector voltage is lowered (from Vc_High to Vc_Mid), then the efficiency is improved, but the distortion characteristics are deteriorated. In addition, although the distortion characteristics are improved as the output power is decreased, the operation efficiency is decreased. Therefore, by lowering the collector voltage, and by inhibiting the output power in the range to satisfy the standards of distortion characteristics, the operation efficiency is improved.

SUMMARY OF THE INVENTION

Since operation efficiency is improved as the distortion characteristics of middle and low outputs are preferred, the improvement of the distortion characteristics of the middle and low output in the time of low collector voltage is demanded. In general, it is known that the distortion characteristics of the middle and low output of the GaAs-HBT power amplifier (times of low collector voltages) are improved by optimizing the capacity of the bias circuit. However, since the capacity of the bias circuit is normally designed so that the distortion characteristics of the high output (the time of high collector voltages) improve, it is not agreed with the optimal value at the time of low collector voltage. Therefore, conventional power amplifier had a problem wherein distortion characteristics deteriorate due to the collector voltage of the amplifying transistor at the time of middle and low output.

In view of the above-described problems, an object of the present invention is to provide a power amplifier which can improve the distortion characteristics of low and medium outputs.

According to the present invention, a power amplifier includes: an amplifier having a base into which input signals are inputted, a collector to which a collector voltage is supplied, and an emitter; and a bias circuit for supplying a bias current to the base of the amplifier, wherein the bias circuit includes a first transistor having a first control terminal in which a reference voltage is inputted, a first terminal to which power voltage is inputted, and a second terminal connected to the base of the amplifier, and a capacity adjusting circuit elevating a capacity between a grounding point and at least one of the first control terminal and the first terminal when the collector voltage of the amplifier is lowered.

The present invention makes it possible to improve the distortion characteristics of low and medium outputs.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
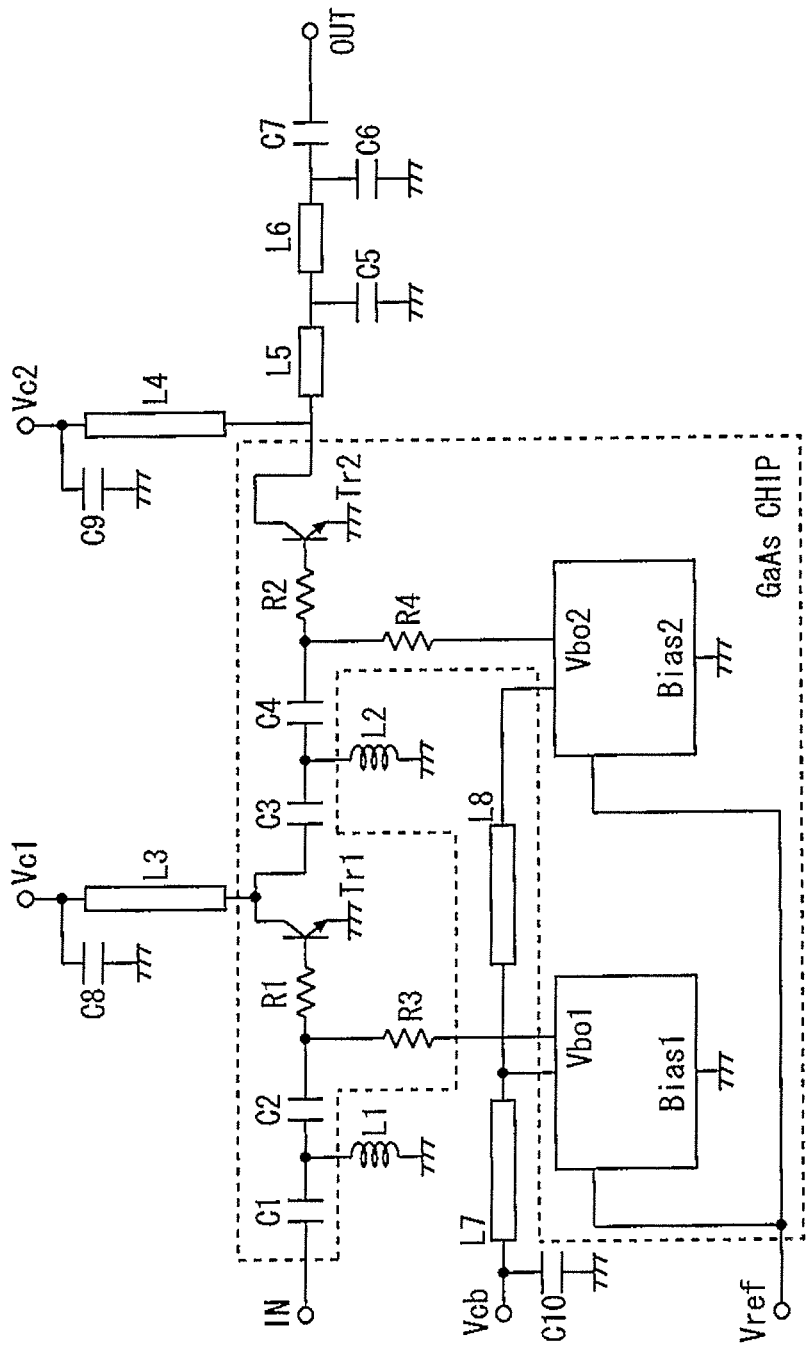
FIG. 1 is a diagram showing a power amplifier according to the first embodiment of the present invention.

FIG. 1 is a diagram showing a power amplifier according to the first embodiment of the present invention. The power amplifier is a two-stage amplifier formed by a Bi FET process wherein an HBT and an FET are formed on the same substrate. GaAs-HBT power amplifiers and the bias circuits are accumulated on the same GaAs chip. The GaAs chip is shown in the broken line frame, and the circuit elements out of the broken line frame are formed on the module substrate with chip parts and lines.

A first stage amplifier Tr1 to amplify input signals and a subsequent stage amplifier Tr2 to amplify the output signals in Tr1 are formed on the same GaAs substrate. Tr1 and Tr2 are GaAs-HBTs. Input signals are inputted into the base of Tr1, a collector voltage is supplied to the collector, and the emitter is grounded. Bias1 is a first-stage bias circuit for supplying the bias current to the base of Tr1, and Bias2 is a subsequent-stage bias circuit for supplying the bias current to the base of Tr2.

IN is a RF signal inputting terminal, OUT is a RF signal outputting terminal, R1 to R4 are resistors, C1 to C10 are capacitors, and L1 and L2 are inductors. L3 to L8 are lines having a specific electric length, and operate as inductors. Vc is a collector power terminal, Vc1 is a collector power terminal for Tr1, Vc2 is a collector power terminal for Tr2, Vcb is a power terminal for Bias1 and Bias2, and Vref is a terminal for supplying the reference voltage to Bias1 and Bias2.

Figure 2:
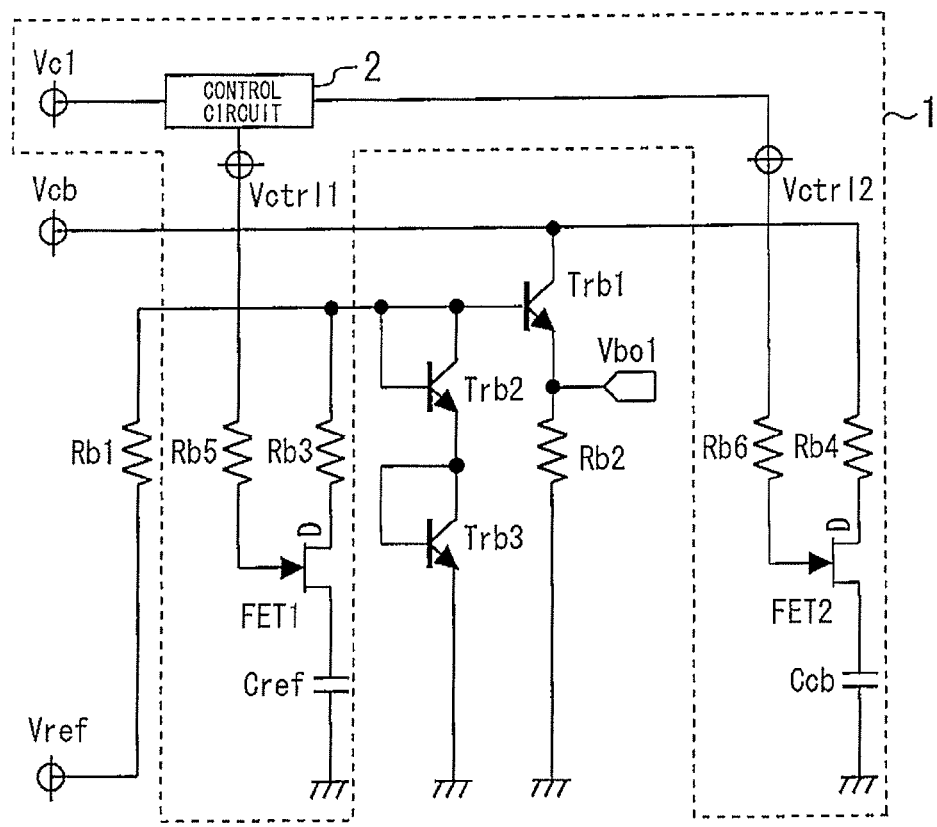
FIG. 2 is a diagram showing a bias circuit according to the first embodiment of the present invention.

FIG. 2 is a diagram showing a bias circuit according to the first embodiment of the present invention. The bias circuit is a first-stage bias circuit Bias 1 for supplying a bias current to the base of the first-stage amplifier Tr1 shown in FIG. 1. Also, the constitution of the subsequent-stage bias circuit Bias 2 is identical.

In the base of the transistor Trb1, a reference voltage is inputted via Vref terminal and a resistor Rb1. To the collector of Trb1, the power voltage is inputted via the Vcb terminal. The emitter of Trb1 is connected to the base of the first stage amplifier Tr1 via the Vbo1 terminal. Between the emitter of Trb1 and the grounding point, a resistor Rb2 is connected. Between the base of Trb1 and the grounding point, Trb2 and Trb3 of which the bases and collectors are short-circuited are connected in series.

The capacity adjusting circuit 1 has transistors FET1 and FET2, resistors Rb3 to Rb6, capacitors Cref and Ccb, and a control circuit 2. Transistors FET1 and FET2 are GaAs-FETs of which threshold voltage is −0.2 to −1.0 V.

The drain of FET1 is connected to the base of Trb1 via Rb3. Cref is connected between the source of FET1 and the grounding point. The drain of FET2 is connected to the collector of Trb1 via Rb4. Ccb is connected between the source of FET2 and the grounding point. The control circuit 2 supplies control voltages Vctr11 and Vctr12 to the gates of FET1 and FET2 via Rb5 and Rb6, respectively.

Rb3 and Rb4 have the action to make dull the change in impedance when FET1 and FET2 are turned ON/OFF, respectively, and are designed so as to be optimal impedance by the combination with Cref and Ccb.

Figure 3:
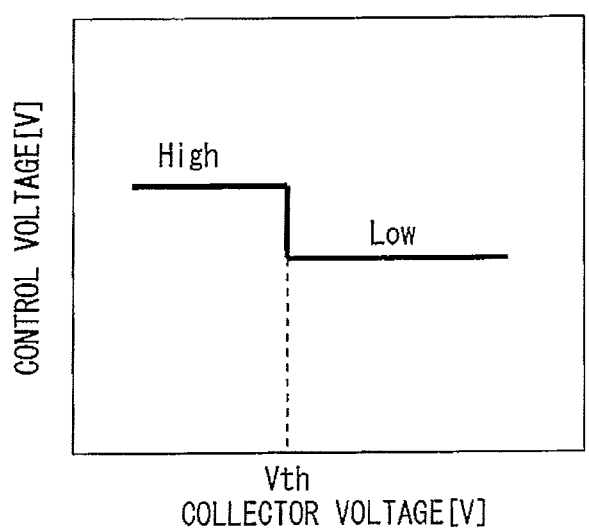
FIG. 3 is a graph showing the relationship between the collector voltage and the control voltage.

FIG. 3 is a graph showing the relationship between the collector voltage and the control voltage. When the collector voltage is lower than the prescribed threshold value Vth, control voltage becomes High. When the collector voltage is higher than the prescribed threshold value Vth, control voltage becomes Low. Therefore, the control circuit 2 turns FET1 and FET2 ON when the collector voltage of the amplifier Tr1 is lower than the prescribed threshold value Vth. However, there is no necessity that FET1 and FET2 are simultaneously turned ON. Thereby, when the collector voltage of the amplifier Tr1 is lowered, the capacity adjusting circuit 1 elevates the capacity of the base of Trb1, and the value between the collector and the grounding point, respectively.

Figure 4:
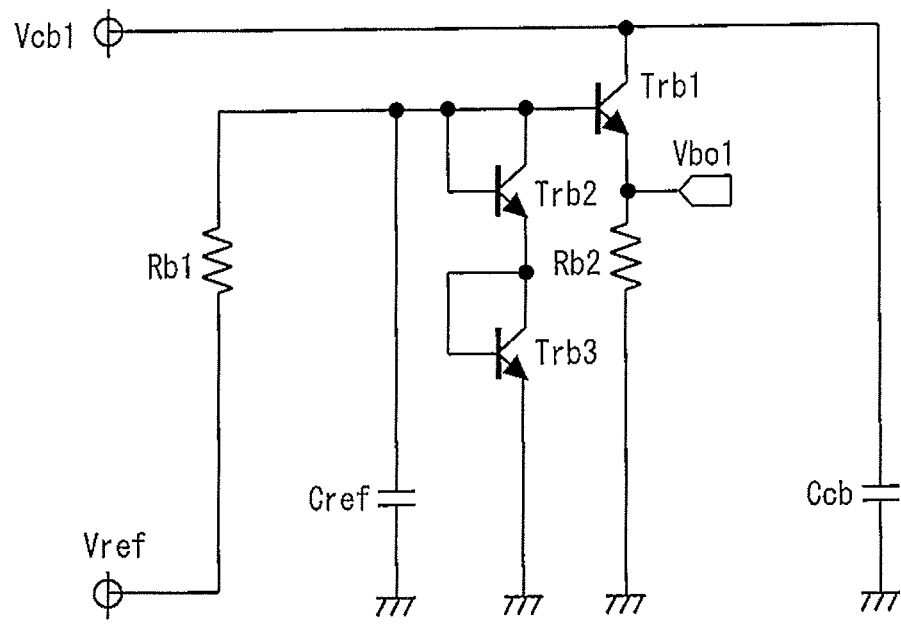
FIG. 4 is a diagram showing a bias circuit according to the comparative example.

Next, the effect of the present embodiment will be described in comparison with the comparative example. FIG. 4 is a diagram showing a bias circuit according to the comparative example. In the comparative example, the capacity adjusting circuit 1 for adjusting the capacity value is not present, but only capacities Cref and Ccb wherein capacity values are fixed are present.

Figure 5:
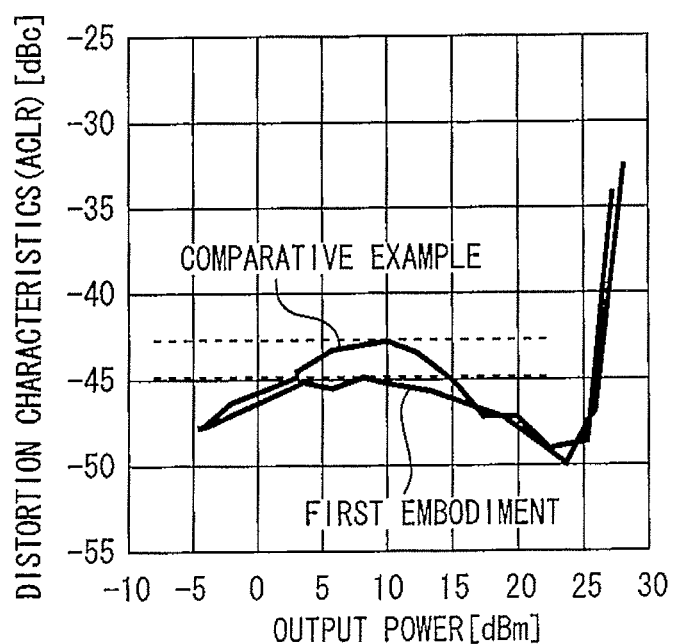
FIG. 5 is a graph showing the distortion characteristics of the first embodiment and a comparative example.

FIG. 5 is a graph showing the distortion characteristics of the first embodiment and a comparative example. In the comparative example, since the capacity values of Cref and Ccb are designed so that the distortion characteristics of high output (the time of high collector voltage) are favorable, these are not necessarily agreed with the optimal values in the time of low collector voltage. For this reason, in the comparative example, the distortion characteristics (ACLR) are deteriorated by the effect of the collector voltage in the time of low and medium outputs. In the first embodiment on the other hand, since the capacity values can be optimized depending on the collector voltage, the distortion characteristics of low and medium outputs can be improved.

Second Embodiment

Figure 6:
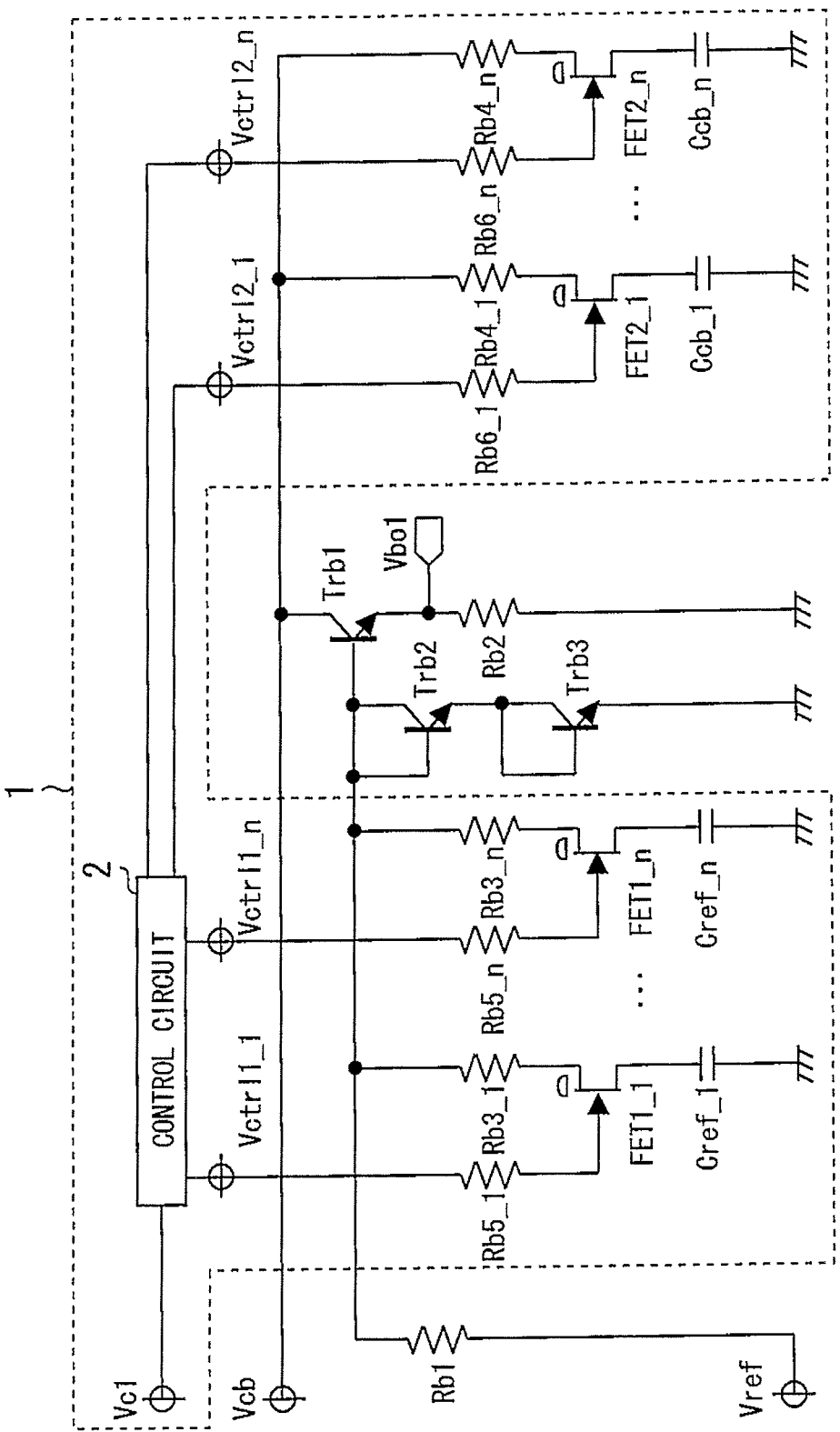
FIG. 6 is a diagram showing the bias circuit according to the second embodiment of the present invention.

FIG. 6 is a diagram showing the bias circuit according to the second embodiment of the present invention. In the present embodiment, the capacity switching portion of the capacity adjusting circuit 1 is multiplied. Specifically, the FET1 in the first embodiment is replaced by n (n: integer of 2 or larger) FET_1, . . . , and FET_n. In the same ways, Cref, Ccb, FET2, and Rb3 to Rb6 are also replaced to the constitution of n.

Thereby, the capacity adjusting circuit 1 changes the capacity value to be multiple staged depending on the collector voltage of the amplifier Tr1. Therefore, the capacity value can be finely optimized to the variation of the collector voltage compared with the first embodiment, and low-distortion characteristics can be maintained.

Third Embodiment

Figure 7:
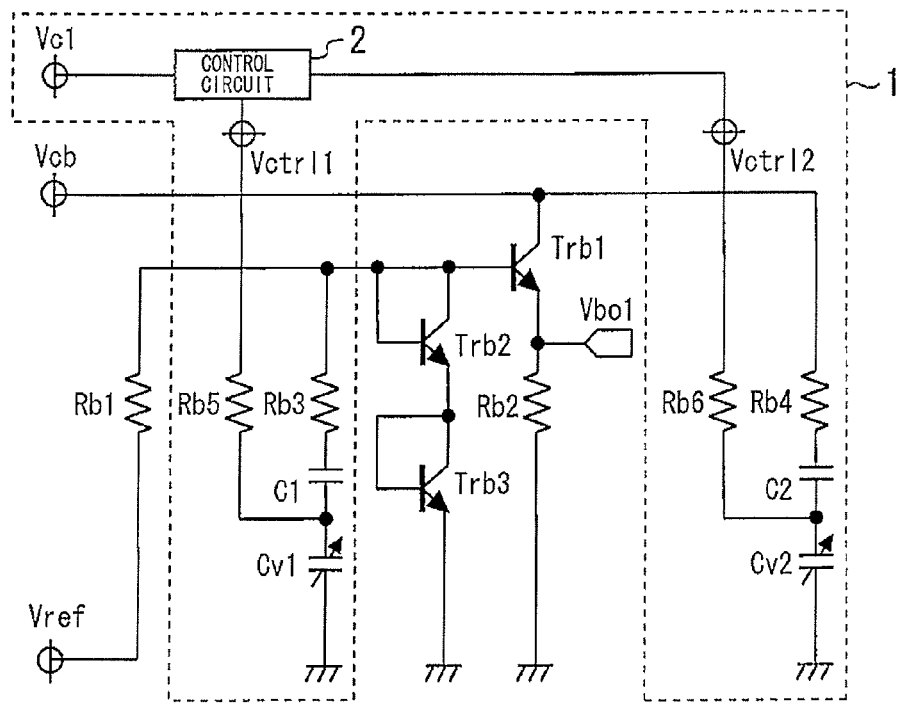
FIG. 7 is a diagram showing a bias circuit according to the third embodiment of the present invention.

FIG. 7 is a diagram showing a bias circuit according to the third embodiment of the present invention. In place of the transistor FET1 and the capacitor Cref in the first embodiment, a fixed capacitor C1 and a variable capacitor element Cv1 are used. In place of the transistor FET2 and the capacitor Ccb, a fixed capacitor C2 and a variable capacitor element Cv2 are used. The variable capacitor elements Cv1 and Cv2 are varactor diodes or the like. C1 and Cv1 are connected in series. C2 and Cv2 are also connected in series.

A control circuit 2 supplies a control voltage to the connecting point of C1 and Cv1 and the connecting point of C2 and Cv2. Thereby, the capacity adjusting circuit 1 analogically changes the capacity value depending on the collector voltage of the amplifier Tr1. Therefore, the capacity value can be finely optimized to the variation of the collector voltage compared with the first embodiment, and low-distortion characteristics can be maintained. Furthermore, the fabricating variations of the fixed capacitors C1 and C2 can also be controlled.

Figure 8:
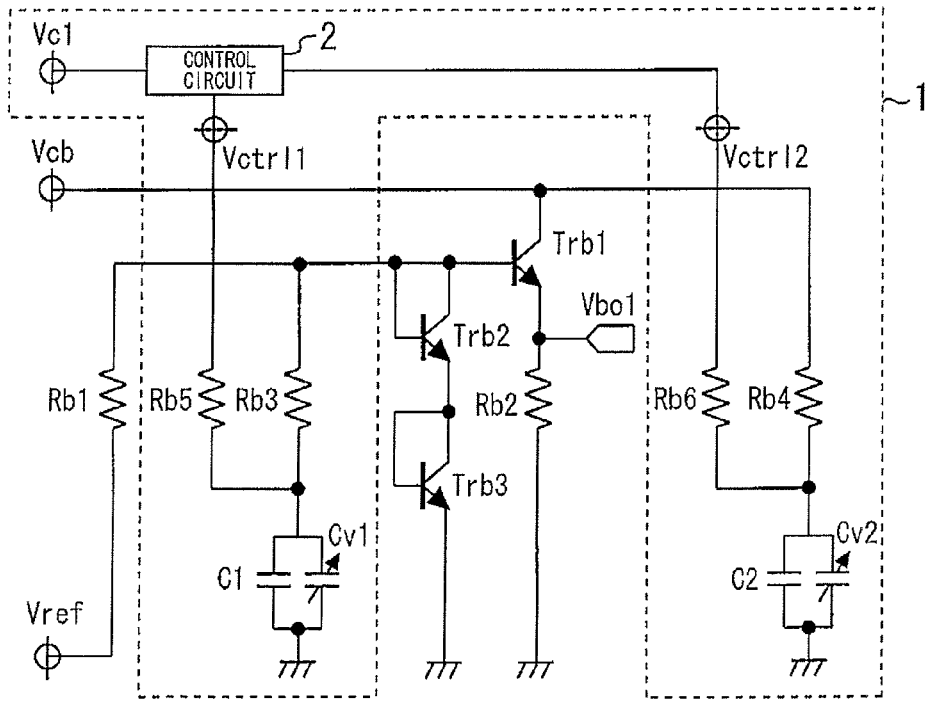
FIG. 8 is a diagram showing a modified example of the bias circuit according to the third embodiment of the present invention.
Figure 9:
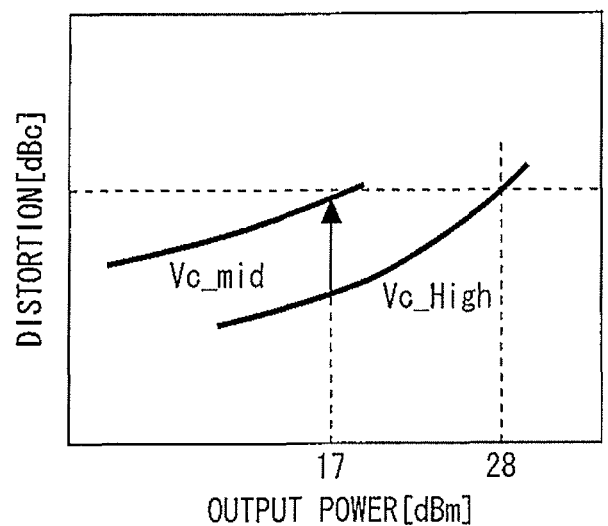
FIG. 9 is a graph showing the relationship between the output power and distortion of the amplifier.
Figure 10:
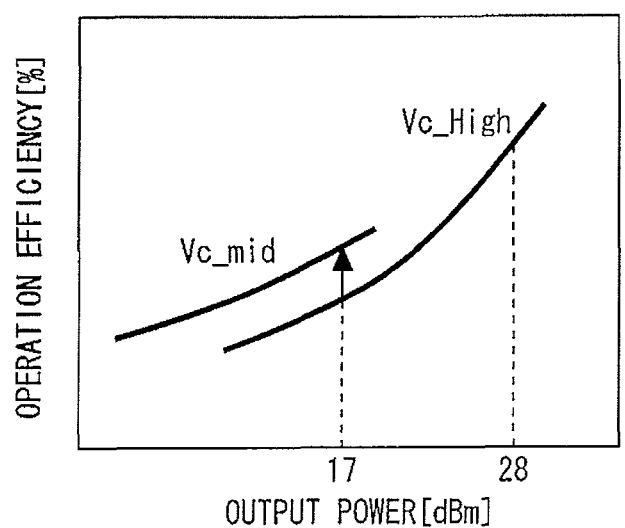
FIG. 10 is a graph showing the relationship between the output power and the operation efficiency of the amplifier.

FIG. 8 is a diagram showing a modified example of the bias circuit according to the third embodiment of the present invention. C1 and Cv1 are connected in parallel, and C2 and Cv2 are connected in parallel. Other configurations are identical to the configurations of the bias circuit shown in FIG. 7, and the identical effects can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-026142, filed on Feb. 9, 2012, including specification, claims, drawings and summary, on which the Convention priority of the present application is based, is incorporated herein by reference in its entirety.

What is claimed is:

1. A power amplifier comprising:
an amplifier having a base into which input signals are input, a collector to which a collector voltage is supplied, and an emitter; and
a bias circuit for supplying a bias current to the base of the amplifier, wherein the bias circuit includes
a first transistor having a first control terminal into which a reference voltage is input, a first terminal to which a power voltage is input, and a second terminal connected to the base of the amplifier, and
a capacitance adjusting circuit elevating capacitance between a grounding point and at least one of the first control terminal and the first terminal when the collector voltage of the amplifier is lowered.

2. The power amplifier according to claim 1, wherein the capacitance adjusting circuit includes:
- a second transistor having a second control terminal, a third terminal connected to the first control terminal or the first terminal of the first transistor, and a fourth terminal;
- a capacitor connected between the fourth terminal and the grounding point; and
- a control circuit supplying a control voltage to the second control terminal of the second transistor.

3. The power amplifier according to claim 2, wherein the control circuit turns the second transistor ON when the collector voltage of the amplifier is lower than a prescribed threshold value.

4. The power amplifier according to claim 1, wherein the capacitance adjusting circuit changes the capacitance in steps.

5. The power amplifier according to claim 1, wherein the capacitance adjusting circuit changes the capacitance continuously.

* * * * *